(12) United States Patent
Goller et al.

(10) Patent No.: US 6,899,543 B2
(45) Date of Patent: May 31, 2005

(54) TEST STRUCTURE FOR DETERMINING THE ELECTRICAL LOADABILITY OF CONTACTS

(75) Inventors: Klaus Goller, Dresden (DE); Roland Wenzel, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/714,576

(22) Filed: Nov. 14, 2003

(65) Prior Publication Data

US 2004/0115963 A1 Jun. 17, 2004

(30) Foreign Application Priority Data

Nov. 15, 2002 (DE) .......................................... 102 53 626

(51) Int. Cl.⁷ .............................................. H01R 12/00
(52) U.S. Cl. ......................................... 439/55; 257/752
(58) Field of Search .............................. 439/55, 59, 62, 439/951; 257/780, 752, 750, 758; 361/777, 783; 29/830; 324/754, 72.5, 73, 158, 765; 438/622, 624, 631; 174/68.5

(56) References Cited

U.S. PATENT DOCUMENTS 5,929,528 A * 7/1999 Kinugawa .................... 257/776
6,413,847 B1    7/2002 Yeh et al.
6,600,227 B1 * 7/2003 Chiu et al. .................. 257/752

FOREIGN PATENT DOCUMENTS

| JP | 63236319 A | 10/1988 |
| JP | 09321248 A | 12/1997 |
| WO | WO 02/067318 A2 | 8/2002 |

* cited by examiner

*Primary Examiner*—Alexander Gilman
(74) *Attorney, Agent, or Firm*—Slater & Matsil, L.L.P.

(57) ABSTRACT

A test structure can be used to determine the electrical loadability of contacts. This structure includes a first interconnect line and a second interconnect line arranged above the first interconnect line. A via electrically couples the first interconnect line to the second interconnect line. A plurality of additional conductive structures are arranged in a closely adjacent manner around the via. These additional structures lie in the same plane as either the first interconnect line or the second interconnect line.

20 Claims, 2 Drawing Sheets

TEST STRUCTURE FOR DETERMINING THE ELECTRICAL LOADABILITY OF CONTACTS

TECHNICAL FIELD

The invention relates to a test structure for determining the electrical loadability of contacts, in particular of electrical connections between interconnects which are arranged one above the other by means of vias arranged in contact holes on a test chip.

BACKGROUND

It is known that, when fabricating large scale integrated circuits, in particular when producing the individual wiring planes (e.g., the polysilicon layer or aluminum layer), defects and consequently faults may occur which may cast doubt on the operation of circuits of this type or lead to premature failure.

In order to be able to make a somewhat reliable prediction in this case, test structures in the form of geometric configurations have been developed. It is possible to use the test structures to reliably detect defects within a large area. The bonding pad configurations of customary standard chips are used in order to make contact for test purposes. The test structures are fabricated in small numbers on test chips in parallel with actual production and are then subjected to corresponding test procedures. It has proven to be favorable in this case if the test chips are arranged simultaneously with the actual chips to be produced on the same wafer and thus pass through the same production process.

"Square" test structures in the form of a three dimensional or two dimensional matrix are examples of test structures of this type with the result that it is also possible in principle to detect faults in vertical structures (vias). In particular, testing of the electrical loadability of the vias between the metal planes is particularly important in this case during product or technology qualification. Special acceleration methods can then be used to make a statement on the maximum current-carrying capacity or dielectric strength, while indicating a maximum lifetime and operation temperature.

In order to achieve this, in the case of "downstream" or "upstream" structures, that is to say vias having a corresponding current direction, the respectively critical junction (via to metal track) should be realized with minimal overlap. This is generally the region of the landing pad, that is to say, in the case of real chips, the contact area between two metal planes, on which one or more vias are positioned. The "worst case" can thus be simulated in a test structure, that is to say the worst case is assumed when arranging the contacts and the selected overlap in the test structure for testing.

It is not possible, however, in the test structures, which have been disclosed hitherto, to simulate cases of very high to maximum coverage density. In this case, the problem resides in the fact that process-dictated uncontrolled expansion which results in a distinct projection may occur in the region of the landing pad during fabrication of the uppermost interconnect. The expansion occurs during the exposure and development of the photoresist (resist) and the subsequent patterning of the interconnect and is therefore dictated by the process. Test structures of this type may be used to cover only some of the requisite tests which cannot, however, reliably simulate the critical case at any time but only reflect considerably more relaxed conditions than in product design.

SUMMARY OF THE INVENTION

In a first aspect, the invention provides a test structure for determining the electrical loadability of junctions between metal tracks. It is possible to use the test structure in a simple manner to test a high to very high coverage density for the worst case. For example, this result can be achieved in a test structure of the type mentioned initially by additional structures being arranged adjacently with a prescribed spacing around the contact hole within the uppermost interconnect plane and/or the interconnect plane lying below the latter.

The result of this particularly simple solution, the production of a "nested environment," is that the expansion which is possible in standard structures of circuits during the photolithography and the subsequent patterning of the interconnects is reliably avoided in the test structures.

As a continuation of the invention, the additional structures are in the form of dummy structures with or without any circuitry function, it being possible for the additional structures to be dummy interconnects or electrically active interconnects.

In one particular refinement of the invention, at least one dummy interconnect is arranged around the contact hole, thus preventing any uncontrolled expansion and ensuring a minimum coverage, as prescribed in the circuit layout in accordance with the design rules.

The interconnects of the corresponding interconnect plane and the dummy interconnects in the same interconnect plane are composed of the same material, for example a metal such as aluminum, copper or tungsten or a semiconductor such as polysilicon.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
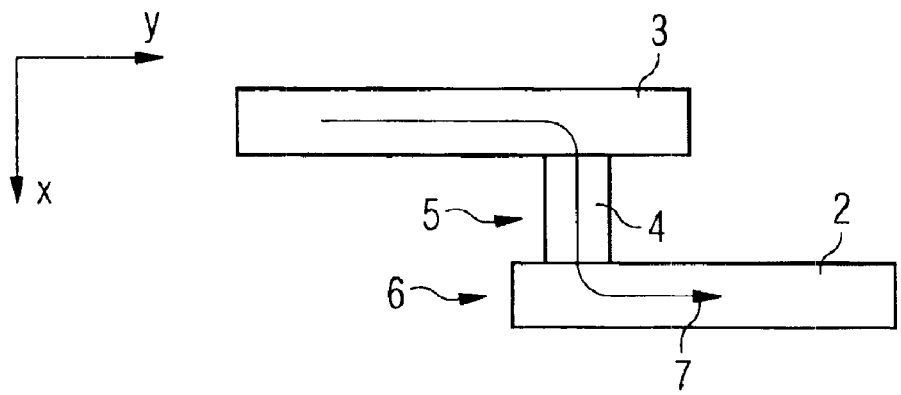
FIG. 1 is a diagrammatic cross section of interconnects which are located one above the other (metallization plane 3 and metallization plane 4) and a via connecting the interconnects by means of a contact hole, in the form of a "downstream structure"

FIG. 1 shows a diagrammatic illustration of a test structure having an interconnect 2 of the metallization plane 3 (Me3) and an interconnect 3 of the metallization plane 4 (Me4) lying above the metallization plane 3. The interconnects are electrically connected to one another by means of a via 4 in a contact hole 5 between the two interconnects 2, 3. In this case, the critical edge 6 is to be regarded as being the junction between the via 4 and the interconnect 2 (in the case of a downstream structure). In the case of an "upstream structure," the critical edge (not shown) would accordingly be the junction between the via 4 and the interconnect 3.

In the present case, the arrow 7 shows the direction of current flow. This current flow (arrow 7) results in degeneration of the lower interconnect 2 (the upper track in the case of upstream structures), which may lead to the contact being broken between the via 4 and interconnect 2. In this case, the time to failure depends on the overlap between the contact area of the contact and the interconnect in the region of the critical edge 6, the minimum overlap being defined by means of technology-defined design rules.

Under production conditions, a maximum coverage density of the metallization is sought by placing the requisite wiring as densely as possible in the circuit layout in order to minimize the chip area, the overlap between the interconnect 2 and the via 4 being minimal in this case.

The smaller the overlap, the lower the electrical loadability of the contact. Larger overlaps lead to a longer service life. For technology qualification, the minimum overlap must therefore be tested since these results may be used as examples for all possible overlaps. Only these results obtained in this manner are incorporated in the design rules. A discrimination between cases, in a manner dependent on the overlap produced, is not undertaken in product design. For this reason, details in the design rules are always the "worst case" situation.

Figure 2:
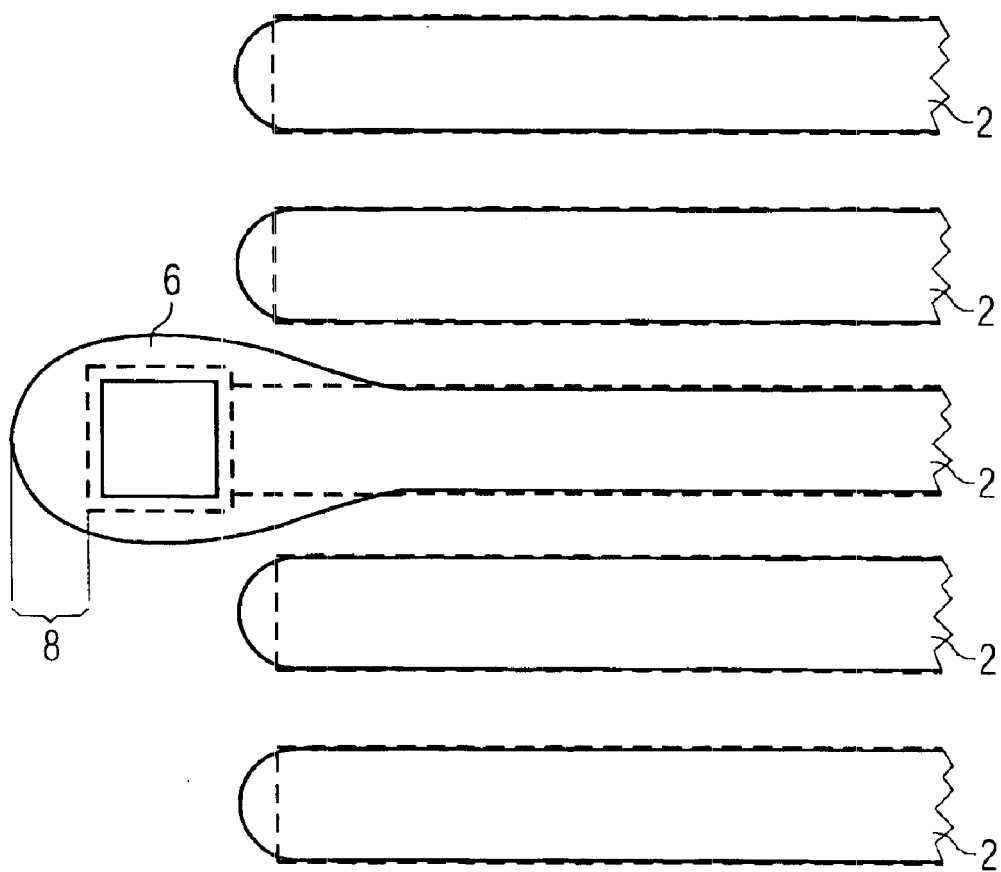
FIG. 2 shows a diagrammatic illustration of the interconnects of the metallization plane 3 with distorted structure properties on account of the expansion of the interconnects of this metallization plane.

For test purposes, a minimum overlap should be produced for the junction between the interconnect 2 and the via 4. The interconnect 2 normally expands considerably as a result of the process (FIG. 2). For the purposes of comparison, the layout dimensions, including the minimum overlap of approximately 50 μm, are depicted here by dashes. The overlap has been expanded multiply at the critical edge 6, which would result in a much too optimistic technology qualification. This expansion results on account of the process during the exposure of the resist and the subsequent patterning of the interconnects 2, 3 (etching) in an environment that is not "nested."

Figure 3:
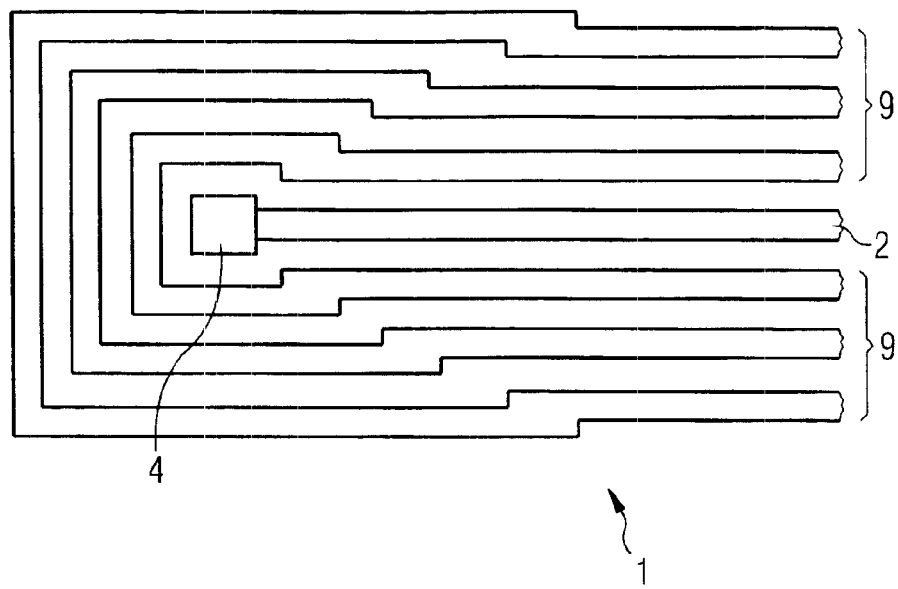
FIG. 3 shows a diagrammatic illustration of the metallization plane 3 having, in accordance with the invention, dummy interconnects arranged around the active interconnect.

In accordance with a preferred embodiment of the invention, this may be reliably prevented with the production of test structures 1, by producing a "nested" environment by means of dummy interconnects 9 around the interconnect 2 and the via 4 (critical structure) (FIG. 3). The dummy interconnects 9, which are composed of metal, e.g., Al, Cu, serve no electrical purpose for the example of a test structure described herein. Rather, they "simulate" only a maximum coverage density around the critical structure. This maximum coverage density then corresponds to the real conditions in the product and also to the critical case of minimum ("worst case"). It goes without saying that electrically active tracks of adjacent structures may also be used as dummies for the test structure.

Figure 4:
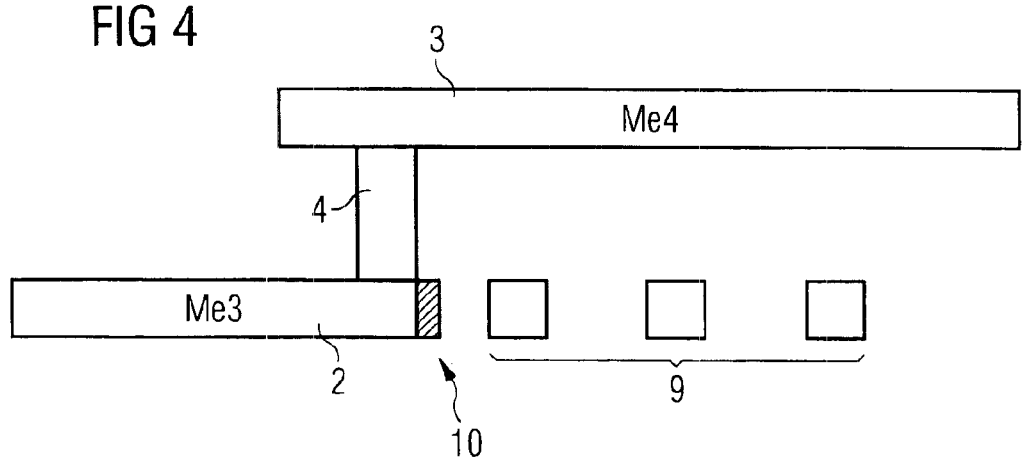
FIG. 4 shows a diagrammatic sectional illustration of the arrangement shown in FIG. 3.

FIG. 4 shows a diagrammatic cross section through a test structure 1 according to the invention, in which a "nested" structure having dummy interconnects 9 is illustrated in the metallization plane 3 (Me3). When analyzing sectional images under an electron beam microscope, it has been found that a larger overlap than envisaged in the circuit design (expansion 8) has been suppressed in the same planes. The minimum coverage 10 realized is shown diagrammatically in the diagrammatic illustration shown in FIG. 4.

It is also possible to proceed in a corresponding manner in other metallization or contact planes.

Although the present invention and its advantages have been described in detail, it should be understood that various changes, substitutions and alterations can be made herein without departing from the spirit and scope of the invention as defined by the appended claims.

What is claimed is:

1. A test structure comprising:
   a first conductive line;
   at least one insulating layer adjacent the first conductive line;
   a via formed in a contact hole in the at least one insulating layer, the via being electrically coupled to the first conductive line;
   a second conductive line disposed in a plane of the first conductive line, the second conductive line extending parallel to a first edge of the first conductive line, extending around the via, and extending parallel to a second edge of the first conductive line, wherein the first edge is opposed to the second edge; and
   a third conductive line disposed in the plane of the first conductive line, the third conductive line extending parallel to the first edge of the first conductive line, extending around the via, and extending parallel to the second edge of the first conductive line such that the second conductive line is disposed between the first conductive line and the third conductive line.

2. The test structure of claim 1 wherein the second conductive line and the third conductive line comprise conductive structures that serve a circuitry function.

3. The test structure of claim 1 wherein the at least one insulating layer overlies the first conductive layer.

4. The test structure of claim 1 wherein the at least one insulating layer underlies the first conductive layer.

5. The test structure of claim 1 wherein the distance between the first edge of the first conductive line and a first edge of the second conductive line is substantially equal to the distance between a second edge of the second conductive line and an edge of the third conductive line.

6. The test structure of claim 1 wherein the second conductive line and the third conductive line comprise dummy structures that are not coupled to any circuitry function.

7. The test structure of claim 6 wherein the dummy interconnects essentially surround the via in an equidistant manner.

8. The test structure of claim 6 wherein the first, second and third conductive lines are comprised of copper.

9. The test structure of claim 1 and further comprising a fifth conductive line disposed in a plane that is different than the plane of the first conductive line, the fifth conductive line electrically coupled to the first conductive line through the via.

10. The test structure of claim 9 wherein the fifth conductive line is disposed in a plane that is below the plane of the first conductive line.

11. The test structure of claim 9 wherein the fifth conductive line is disposed in a plane that is above the plane of the first conductive line.

12. The test structure of claim 1 and further comprising a fourth conductive line disposed in the plane of the first conductive line, the fourth conductive line extending parallel to the first edge of the first conductive line, extending around the via, and extending parallel to the second edge of the first conductive line such that the second and third conductive lines are disposed between the fist conductive line and the fourth conductive line.

13. The test structure of claim 12 wherein the first, second, third and fourth conductive lines comprise aluminum lines.

14. The test structure of claim 12 wherein the first, second, third and fourth conductive lines comprise copper lines.

15. The test structure of claim 12 wherein the first, second, third and fourth conductive lines comprise polysilicon lines.

16. The test structure of claim 1 wherein the first, second and third conductive lines are comprised of the same material.

17. The test structure of claim 16 wherein the first, second and third conductive lines are comprised of polysilicon.

18. The test structure of claim 16 wherein the first and second interconnects and the additional structures are comprised of metal.

19. The test structure of claim 18 wherein the first, second and third conductive lines are comprised of aluminum.

20. The test structure of claim 18 where in the first, second and third conductive lines are comprised of copper.

* * * * *

UNITED STATES PATENT AND TRADEMARK OFFICE
CERTIFICATE OF CORRECTION

PATENT NO. : 6,899,543 B2
DATED : May 31, 2005
INVENTOR(S) : Goller et al.

It is certified that error appears in the above-identified patent and that said Letters Patent is hereby corrected as shown below:

Column 5,
Line 21, delete "fist" and insert -- first --.

Signed and Sealed this

Ninth Day of August, 2005

JON W. DUDAS
*Director of the United States Patent and Trademark Office*